United States Patent [19]

Mehta

[11] Patent Number: 5,756,367
[45] Date of Patent: May 26, 1998

[54] METHOD OF MAKING A SPACER BASED ANTIFUSE STRUCTURE FOR LOW CAPACITANCE AND HIGH RELIABILITY

[75] Inventor: Sunil D. Mehta, San Jose, Calif.

[73] Assignee: Advanced Micro Devices, Inc., Sunnyvale, Calif.

[21] Appl. No.: 449,384

[22] Filed: May 23, 1995

Related U.S. Application Data

[62] Division of Ser. No. 335,283, Nov. 7, 1994.

[51] Int. Cl.⁶ .................. H01L 21/70; H01L 27/00
[52] U.S. Cl. .................. 437/60; 437/195; 437/922; 257/530
[58] Field of Search .................. 437/195, 922, 437/60; 257/530

[56] References Cited

U.S. PATENT DOCUMENTS

| | | |
|---|---|---|
| 4,203,123 | 5/1980 | Shanks .................. 357/2 |
| 4,670,970 | 6/1987 | Bajor . |
| 4,748,490 | 5/1988 | Hollingsworth .................. 357/51 |
| 5,100,827 | 3/1992 | Lytle .................. 437/52 |
| 5,120,679 | 6/1992 | Boardman et al. .................. 437/195 |
| 5,233,217 | 8/1993 | Dixit et al. .................. 257/530 |

FOREIGN PATENT DOCUMENTS 0 224 418  3/1987  European Pat. Off. .

Primary Examiner—Charles L. Bowers, Jr.
Assistant Examiner—Lynne A. Gurley
Attorney, Agent, or Firm—Skjerven, Morrill, MacPherson, Franklin & Friel; Edward C. Kwok

[57] ABSTRACT

The present antifuse includes a base having a first electrode thereon which defines a top surface and a side surface. Antifuse material is disposed on the first electrode on at least a portion of the top surface and at least a portion of the side surface, with a second electrode on the antifuse material. Due to this configuration, defect problems in etching oxide as part of the antifuse structure are avoided, and meanwhile capacitance of the device is very low.

5 Claims, 2 Drawing Sheets

METHOD OF MAKING A SPACER BASED ANTIFUSE STRUCTURE FOR LOW CAPACITANCE AND HIGH RELIABILITY

This application is a division of application Ser. No. 08/335,283, filed Nov. 7, 1994.

FIELD OF THE INVENTION

This invention relates to antifuses, and more particularly, to an antifuse the design of which has low capacitance and promotes high yield.

BACKGROUND OF THE INVENTION

Antifuses are commonly used in large field programmable gate arrays. Typically, in a gate array to be programmed, all such antifuses are initially in a non-conducting state. Certain antifuses are chosen to become conductors, while others remain nonconductors. It is of course important to the proper operation of the programmed device that those antifuses chosen to remain non-conductive function in that way. With a field programmable gate array generally containing many hundred of thousands of antifuses, it is difficult to achieve this with a typical prior art type of antifuse, which will now be described.

FIGS. 1 through 4 show the fabrication of a typical prior art antifuse 10. As shown therein (FIG. 1), initially, a metal electrode 12 is provided over a silicon dioxide base 14. Next, an oxide layer 16 is deposited over the metal electrode 12. After application and patterning of a layer of photoresist, the oxide layer 16 is etched to provide an opening therein down to the electrode 12, to expose surface 24 of electrode 12. After removal of the patterned resist, a layer of antifuse material 18 such as amorphous silicon is deposited over the resulting structure (FIG. 2), so as to be in contact with a portion of the electrode 12. Resist is applied to the antifuse layer 18, and is patterned so that upon etching of the layer 18, such antifuse material takes the shape shown in FIG. 3.

After removal of such resist, a layer of metal 20, forming the second electrode, is deposited and patterned as shown in FIG. 3.

It has been found that the etching step of the oxide layer 16 down to the electrode 12 can cause yield problems, as now described, and with reference to FIG. 4, an enlarged view of a portion of FIG. 3.

As the etching of the oxide layer 16 takes place, it is common that a sharp corner is not formed in the areas 22 where the oxide 16 is adjacent the electrode 12. Rather, it will sometimes happen that resist residue and/or irregular oxide 23 remain in corners at areas 22 when etching is completed, i.e., when the electrode surface 24 is exposed. This flaw in the structure can cause a leakage path from the one electrode to the other, resulting in an antifuse which should be a nonconductor acting as a conductor. The problem lies in the unevenness of this etching in such a small device.

While such a flaw is relatively uncommon, it will be understood that each antifuse of the many hundreds of thousands thereof must operate properly.

Furthermore, because of the relatively large contact area between the antifuse layer 18 and the electrode 12 at surface 24, the antifuse 10 exhibits a high capacitance, resulting in degradation of performance of the device. Additionally, such an antifuse 10 takes up a substantial area as measured laterally. Lastly, the step coverage of metal 20 can be very poor when the aspect ratio of the contact opening is very high, (i.e., deep, small contacts).

SUMMARY OF THE INVENTION

The present antifuse structure, and method of fabrication thereof, provides that the antifuse structure includes a base, and a first electrode on the base which defines a top surface and a side surface.

Antifuse material is disposed on the first electrode on at least a portion of the top surface and at least a portion of the side surface thereof, with a second electrode on the antifuse material. The etching of oxide is avoided so as to avoid the defect problems cited above, meanwhile with the area of contact of antifuse material with the first electrode being reduced as compared to the prior art, so that antifuse capacitance is reduced. Meanwhile, the lateral dimension of the antifuse structure is reduced as compared to the prior art structure.

BRIEF DESCRIPTION OF THE DRAWINGS

FIG. 5 shows a first step of the fabrication of an antifuse structure in accordance with the present invention, wherein a metal layer is provided over a base layer;

FIG. 6 is a view similar to that shown in FIG. 5, but further showing the metal patterned and with antifuse material included;

FIG. 7 is a view similar to that shown in FIG. 6, but showing a second electrode applied to the device; and FIG. 8 is a view similar to that shown in FIG. 7, but showing contacts formed with the device, and a metalization layer to contact the first electrode.

DESCRIPTION OF THE PREFERRED EMBODIMENT

Reference is now made to FIGS. 5–8.

Figure 5:
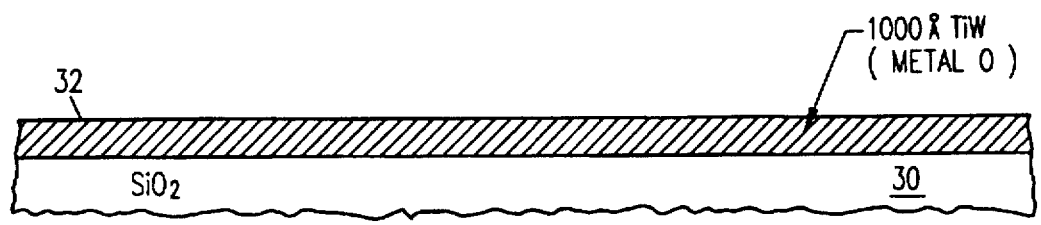
FIGS. 5–8 show the fabrication of an antifuse structure in accordance with the present invention, i.e., in particular.
Figure 6:
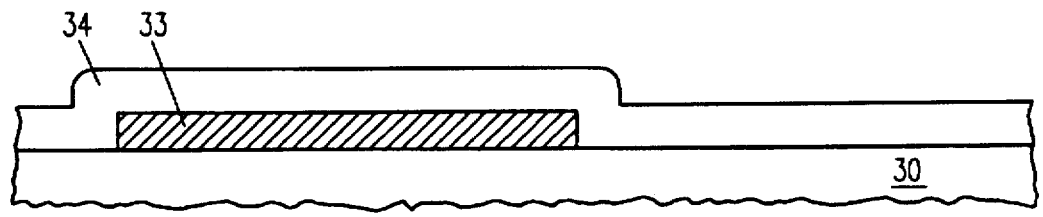

As shown in FIG. 5, initially a layer of silicon dioxide 30 is provided, for example, on a silicon substrate (not shown). A metal layer 32 of for example TiW is deposited over the silicon dioxide 30, to a thickness of for example 1000 Å. Photoresist (not shown) is then patterned on the metal layer 32 and the metal layer 32 is etched to the configuration shown in FIG. 6 to form the first electrode 33. After removal of the photoresist, a layer of amorphous silicon 34 (the antifuse material) is deposited over the resulting structure to a thickness of for example 1000 Å.

Figure 7:
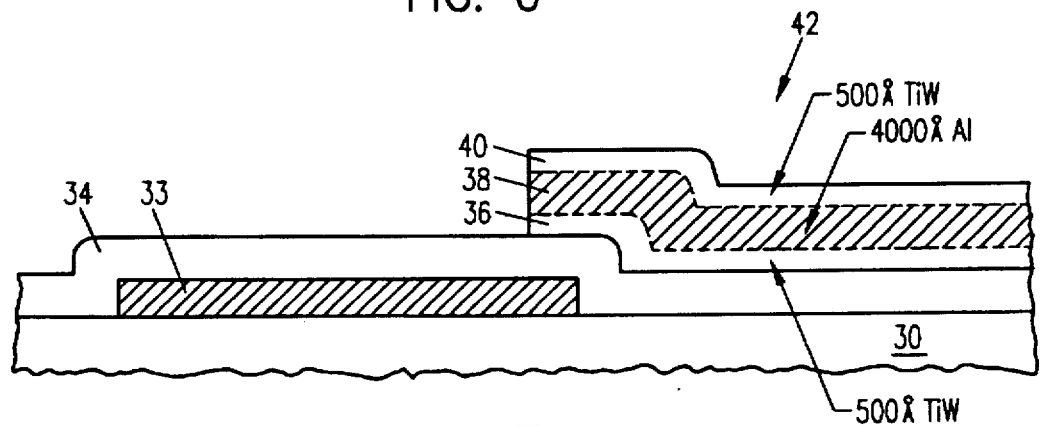

Next, as shown in FIG. 7, a metal layer 36 of for example TiW is deposited over the resulting structure, to a thickness of 500 Å. Subsequent thereto, a 4000 Å thick layer 38 of for example aluminum is deposited over the layer of TiW 36, and then a 500 Å thick layer 40 of for example TiW is deposited over the aluminum layer 38. After application and patterning of a layer of photoresist over the top layer of TiW 40, the metal layer made up of the layers 36, 38 and 40 of TiW, Al, and TiW is etched to form the second electrode 42.

Figure 8:
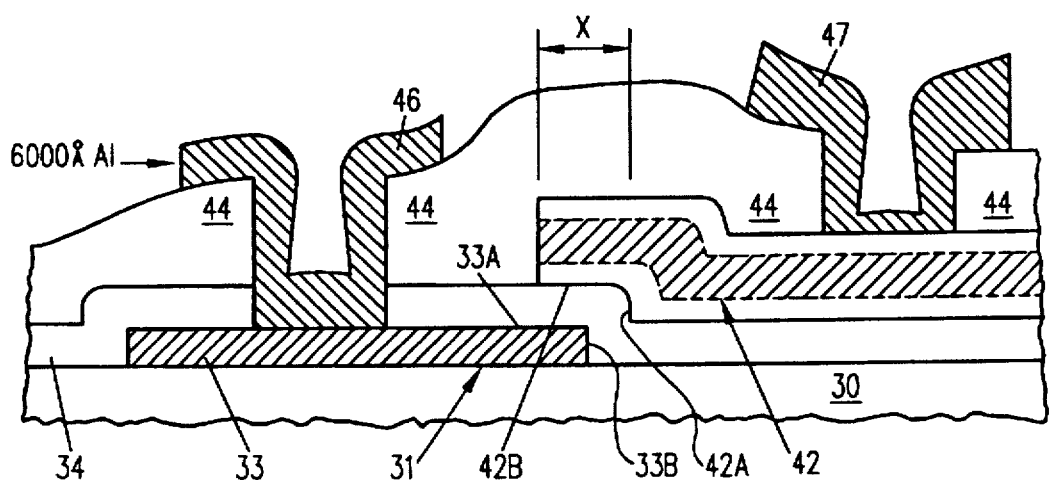

Next, and as shown in FIG. 8, an interlevel dielectric 44 (for example $SiO_2$) is deposited to the thickness of 8000 Å. After application of and patterning of a layer of photoresist on the $SiO_2$ layer, such $SiO_2$ layer is etched to provide an opening therethrough down to the layer 34, which is also etched to provide an opening therethrough to the electrode 33. Meanwhile, the oxide layer 44 is also etched to provide an opening therethrough to the electrode 42.

Upon removal of the photoresist, aluminum contacts 46, 47 are provided to the electrode 33, 42 in accordance with normal practice.

With reference to FIG. 8, it will be noted that a portion of amorphous silicon layer 34 which acts as the antifuse material is disposed on a portion of the top surface 33A of the electrode 33, and a side surface 33B of the electrode 33. In addition, a portion 42A of the electrode 42 is disposed along but spaced from a portion of the side surface 33B. A portion of the layer 34 is also in contact with the oxide 30. A portion of the second electrode 42B is disposed along but spaced from a portion of the top surface 33A of the first electrode 33.

This structure, and the method of fabrication thereof, provide many advantages.

Initially, the etching of oxide to expose an electrode, as in the prior art, is completely avoided. Thus, one need not be concerned about flaws resulting in the oxide as described above. Yield is therefor significantly increased.

Figure 1:
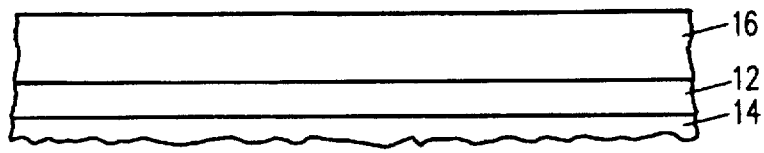
FIGS. 1–4 show the fabrication of a typical antifuse structure as described above.
Figure 2:
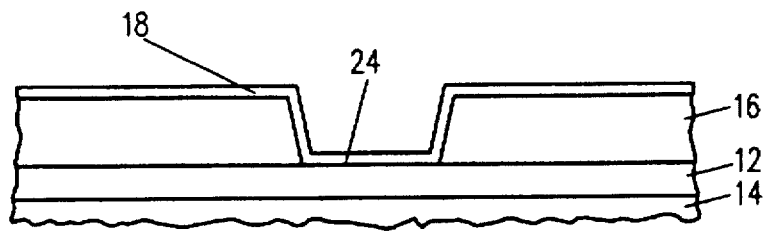
Figure 3:
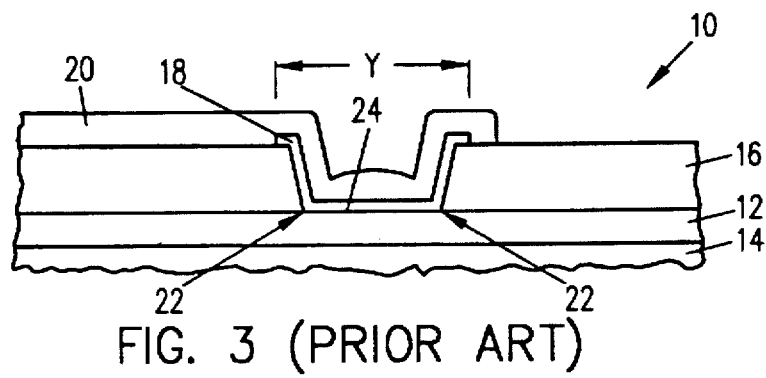
Figure 4:
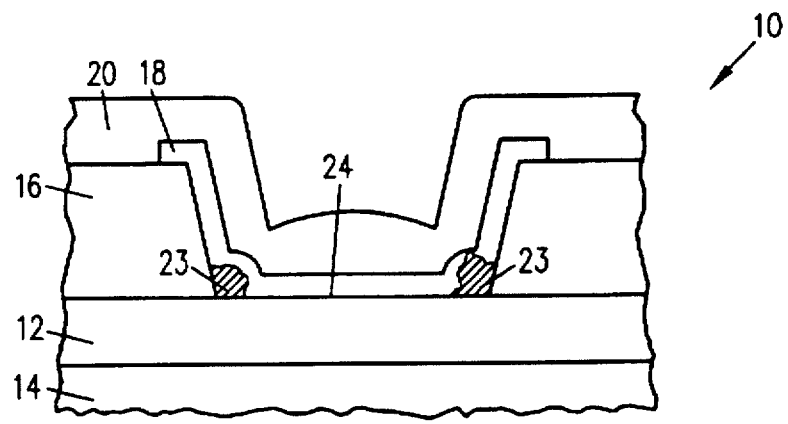

Furthermore, by taking advantage of side surfaces of elements of the device, i.e., portions of the device which do not run laterally across the device, the lateral dimension of the antifuse 10 is reduced greatly. For example, the lateral dimension X (FIG. 8) of the antifuse 10 can be reduced to 0.5 microns or less, in particular 0.3 microns, meanwhile maintaining a very high yield. This is to be compared with the dimension Y from edge to edge of the amorphous silicon 18 in a typical prior art device as shown in FIG. 3, which will run on the order of 1.4 microns.

Lastly, there is no issue with metal step coverage since there is no high-aspect-ratio opening in the present structure.

Thus, it will be seen that in the present antifuse and the method of fabricating such antifuse, many advantages are provided. Initially, as described above, the yield of fabrication is increased. Furthermore, the resulting device takes up a much smaller area than in the prior art.

As will be noted, the actual area of contact of the antifuse material 33 with the electrode 31 in the area defining the functioning antifuse is much smaller than the comparable area of the prior art device. With this reduction in area, capacitance of the device is significantly reduced.

I claim:

1. A method of fabricating an antifuse structure comprising:

providing a base;

providing a first electrode on said base having a top surface and a side surface;

providing an antifuse comprising amorphous silicon on and in direct contact with at least a portion of the top surface and the side surface, so that the amorphous silicon lies along and in direct contact with the side surface; and providing a second electrode on said amorphous silicon.

2. The method of claim 1 and further comprising the step of providing that a portion of the second electrode is disposed along but spaced from at least a portion of the side surface.

3. The method of claim 1 and further comprising the step of providing that a portion of the amorphous silicon is in contact with the base.

4. The method of claim 1 and further providing the step that a portion of the second electrode is disposed along but spaced from at least a portion of the top surface of the first electrode, so as to overlap to an extent said first electrode.

5. The method of claim 1 and further comprising the step of providing the first and second electrodes as metal.

* * * * *